United States Patent [19]

Smedley

[11] 4,057,844
[45] Nov. 8, 1977

[54] MOS INPUT PROTECTION STRUCTURE

[75] Inventor: Sean Anthony Smedley, Saratoga, Calif.

[73] Assignee: American Microsystems, Inc., Santa Clara, Calif.

[21] Appl. No.: 699,527

[22] Filed: June 24, 1976

[51] Int. Cl.² .......................... H02H 7/20; H02H 9/04
[52] U.S. Cl. ............................... 361/111; 307/200 B; 307/304; 357/41
[58] Field of Search ........... 307/202, 205, 304, 200 B; 357/41; 317/31; 361/111

[56] References Cited

U.S. PATENT DOCUMENTS

| | | | |
|---|---|---|---|
| 3,395,290 | 7/1968 | Farina et al. | 307/205 X |
| 3,408,511 | 10/1968 | Bergersen et al. | 307/304 X |
| 3,924,265 | 12/1975 | Rodgers | 357/41 X |
| 3,934,159 | 1/1976 | Nomiya et al. | 307/304 |

Primary Examiner—John S. Heyman

Attorney, Agent, or Firm—Owen, Wickersham & Erickson

[57] ABSTRACT

A breakdown preventing protection structure for an insulated gate field effect semiconductor device is disclosed for limiting input voltages to levels not substantially exceeding the supply voltage. A planar insulated gate field effect protection transistor is provided in series with the input. The protection transistor includes a source forming the circuit input, a drain connected to the gate of the device to be protected, and a gate electrode connected to the supply voltage which also supplies the device to be protected. A shunting protective diode may be included at the source of the protection transistor to limit negative input voltages to the diode threshold voltage and positive input voltages to the reverse avalanche breakdown of the protective diode. The protection circuit is particularly well suited to protect V-groove metal oxide semiconductor devices which have breakdown voltages well below breakdown voltages of conventional planar MOS transistor devices.

1 Claim, 3 Drawing Figures

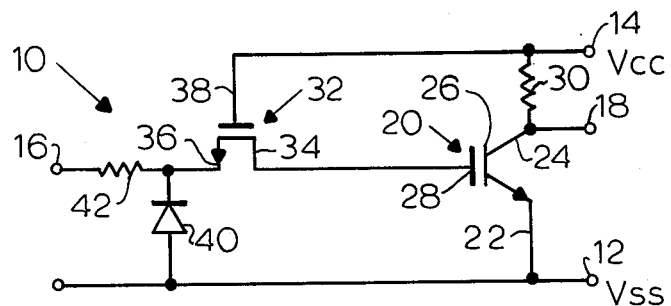
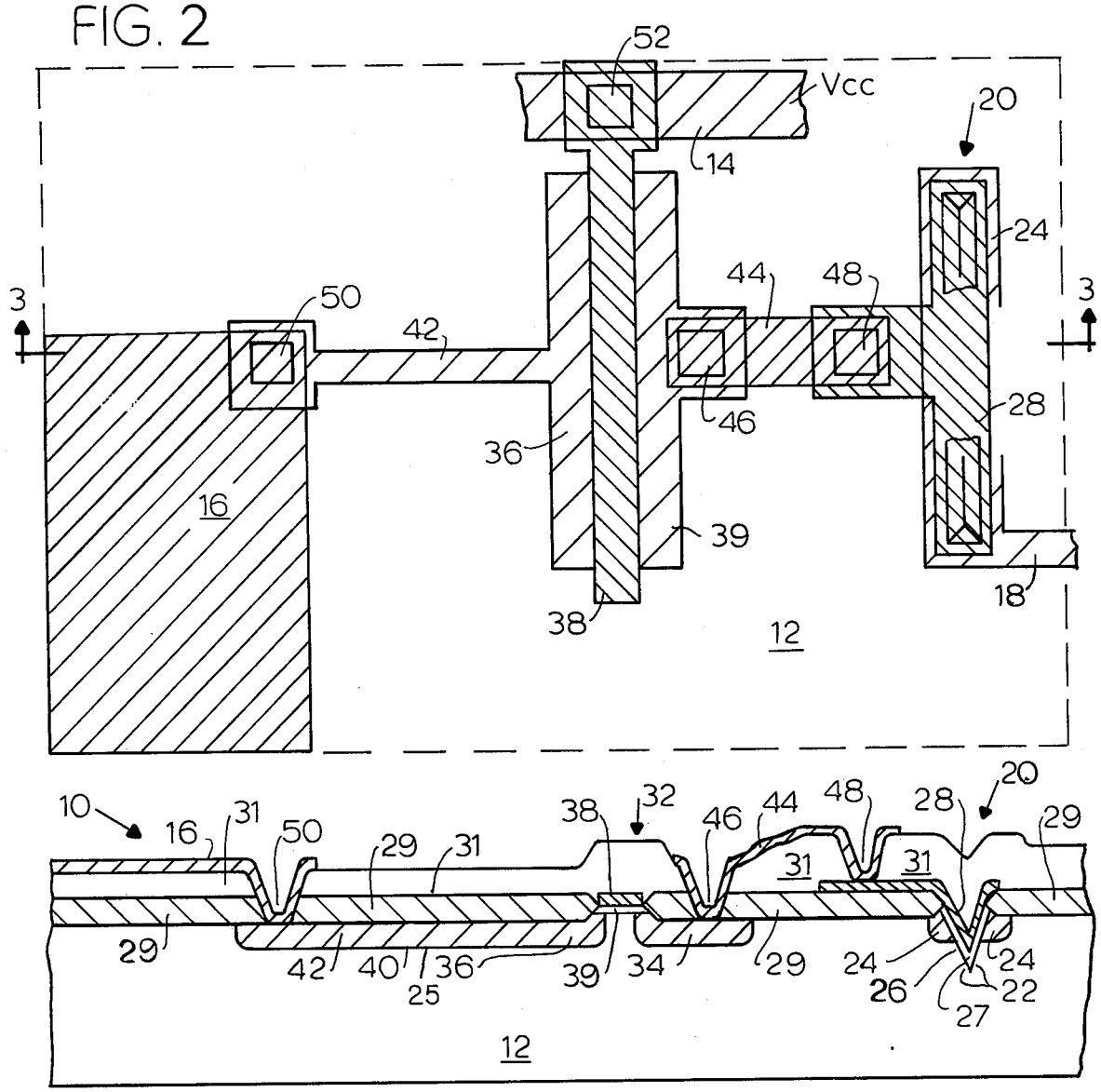

MOS INPUT PROTECTION STRUCTURE

BACKGROUND OF THE INVENTION

This invention relates to a semiconductor device, and more particularly it relates to an insulated gate field effect transistor semiconductor device providing protection against gate rupture and oxide breakdown of MOS devices and integrated circuits.

Insulated gate MOS transistors are typically formed with a thin oxide layer insulating a control gate electrode from the transistor channel over which it lies and controls. Such MOS devices and integrated circuit elements have an extremely high input impedance which makes them particularly sensitive to the accumulation of static charges. Such charges may typically be induced during fabrication, packaging, testing or installation of the integrated circuit. The static charges may reach high voltages which are sufficient to rupture the thin oxide layer resulting in consequent device failure.

Consequently, a common practice has been to provide MOS integrated circuits with protective devices and structures to clamp incoming voltages to levels below the gate oxide rupture or breakdown voltage. Typically those devices were characterized as zener-like diodes and/or series resistors which were often fabricated as a part of the integrated circuit both in combination and separately.

With V-groove MOS structures, the problem of gate oxide breakdown has been acute in that the oxide breakdown voltage of such circuit elements is substantially below the junction breakdown voltage of diodes heretofore utilized to provide input gate protection. The geometric configuration of the V-groove MOS transistor structure results in the gate electrode having either a point or an edge at the bottom of the V-groove. This point or edge has proven to be the cause of the lower breakdown voltage of the underlying thin insulating oxide layers.

Consequently, conventional MOS input gate protection diodes have afforded no protection for preventing gate oxide breakdown in V-groove MOS devices. Therefore, strict handling procedures with thorough grounding of equipment and careful selection of clothing and material have been essential for personnel handling such MOS devices and have not always prevented device ruination on account of gate rupture.

On the other hand, the inclusion of high resistance input resistors to protect V-groove MOS gate oxides has not been a satisfactory solution as such resistors have resulted in undue speed losses which have cancelled gains otherwise available with the V-groove MOS transistor technology, as more fully explained in the assignee's U.S. Pat. No. 3,924,265 issued Dec. 2, 1975.

SUMMARY OF THE INVENTION

With the foregoing limitations and drawbacks in mind, an object of the present invention is to provide an improved gate protection structure for MOS integrated circuits what is effective in preventing rupture of thin insulating gate oxide, particularly in V-groove MOS transistors.

Another object of the present invention is to provide an improved gate protection structure which does not degrade circuit performance or speed.

A further object of the present invention is to provide an improved gate protection structure which is small in size, which utilizes a minimum number of elements and which consumes a minimum of topological area of an integrated circuit chip in which it may be incorporated.

Yet another object of the present invention is to provide an improved gate protection structure which may be implemented in V-groove MOS integrated circuit structures without additional fabrication steps.

These and other objects and advantages are accomplished by providing a series connected planar insulated gate field effect protection transistor between the circuit input connection and the gate electrode of the VMOS transistor to be protected thereby. The protection transistor includes a source, a drain and an insulated gate electrode. The source electrode is connected directly to the input circuit connection point whereas the drain electrode connection is made to the insulated gate electrode of the VMOS transistor being protected. The protection transistor insulated gate electrode is connected to the supply voltage bus to which the drain element of the transistor being protected is also connected (usually through a load element, i.e., resistor or transistor).

The source of the planar transistor may be so formed as to provide a protective diode which protects both the planar protection transistor and the input transistor from negative voltages and further protects the planar protection transistor from gate insulation breakdown and rupture. The source may also be formed to include a relatively low value resistor in series with the input connection to provide further protection without objectionable degradation of circuit speed.

With such a protection diode included, excess negative voltages on the input would be clamped by the diode to one diode threshold voltage drop below the voltage potential of the substrate without resultant damage to either the input V-groove MOS gate or the protection transistor gate oxide insulation.

Excessive positive voltage impulses and static charges are the potentially damaging voltage stresses that are primarily protected against by the circuit of the present invention. In the event that the voltage at the input rises to a point within the threshold voltage level of the planar transistor below the positive supply voltage, the planar transistor thereupon ceases to conduct and thereby completely isolates the gate electrode of the VMOS transistor being protected from any higher input voltage levels appearing at the input terminal. For an example, with N-channel devices, assume $V_{DD}$ to be the supply voltage, $V_T$ the threshold voltage of the planar MOS transistor, $V_{IN}$ the input voltage, and $V_{GV}$ the gate voltage of the V-groove transistor which is being protected. The following table then illustrates the condition of the planar protective transistor and the gate voltage of the V-groove transistor under steady state conditions:

| Input Voltage | Protective Transistor | Protected Transistor Gate Voltage |
|---|---|---|
| $V_{IN} < 0$ | conducting | clamped at diode voltage below ground |
| $0 \leq V_{IN} \leq V_{DD} - V_T$ | conducting | $V_{GV} \approx V_{IN}$ |
| $V_{DD} - V_T \leq V_{IN}$ | non-conducting | $V_{GV} = V_{DD} - V_T$ |

If the voltage at the input continued to rise in amplitude, it would eventually be limited by the reverse breakdown voltage of the protective diode, which is well below the rupture voltage of the protective planar MOS gate oxide.

Other objects, advantages and features of the invention will become apparent from the following detailed description of a preferred embodiment presented in accordance with the accompanying drawings.

BRIEF DESCRIPTION OF THE DRAWINGS

FIG. 1 is a schematic circuit diagram of an MOS protection circuit structure of the present invention as applied to protect the gate oxide insulation against breakdown in a V-groove MOS inverter circuit.

FIG. 2 is a greatly enlarged plan view of a topological layout of the protection circuit structure shown in FIG. 1 with the load element of the V-groove MOS inverter circuit omitted.

FIG. 3 is a sectional view of the greatly enlarged topology of FIG. 2 as taken along the line 3—3 therein.

DETAILED DESCRIPTION OF A PREFERRED EMBODIMENT

Referring first to FIG. 1, an input inverter circuit 10 having the protection structure of the present invention is formed preferably as a portion of a monolithic integrated circuit substrate 12 which includes a positive voltage ($V_{CC}$) supply bus 14, an input connection terminal 16 and an output connection terminal 18. The supply voltage return $V_{SS}$ is connected directly to the substrate 12. An input-protected V-groove MOS transistor 20 includes a source electrode 22, and a drain electrode 24. A gate electrode 28 is insulated from the source 22 and drain 24 by a thin layer of oxide 27 (as shown in FIG. 3). A load device 30, which is shown as a resistor although it could be a transistor, is connected from the drain element 24 to the positive supply voltage bus 14. The drain element 14 also forms the output connection 18.

A planar protection insulated gate field effect transistor 32 is series connected between the input terminal 16 and the gate electrode 28. The transistor 32 includes a drain 34 connected to the gate electrode 28, a source 36, and an insulated gate electrode 38 connected to the positive bus 14. The source 36 is connected to the substrate 12 through a reverse biased diode 40 and to the input terminal 16 through an optional resistor 42. This resistor 42 is commonly a diffused resistor, although any fabrication method that provides a suitable resistance may be utilized. The diode 40 and the resistor 42 may be formed as a single diffusion which may be an extension of the source diffusion 36 as shown in FIGS. 2 and 3.

Referring now to FIGS. 2 and 3, a typical fabrication of the input protected circuit structure 10 is shown as formed on a major surface of an impurity doped substrate 12 which provides directly the source 22 of the V-groove MOS device 20. The space charge or drift region 25 of the substrate 12 includes a subportion 26 commonly referred to as a base. The drain 24 is formed as a rectangular diffusion surrounding the V-groove immediately above the subportion 26. A thin gate oxide 27 is formed downwardly along the walls of the V-groove, and is subsequently covered by a deposition of polysilicon to provide the gate electrode 28. Field oxide 29 is provided to separate the gate electode 28 from the drain diffusion 24 on all sides of the elongated V-groove depression in the substrate and elsewhere on the substrate 12.

The planar MOS transistor element 32 is formed in accordance with fabrication techniques well known to those skilled in the art. The drain 34 may constitute a diffusion or implantation which may be formed simultaneously with formation of the drain 24 of the VMOS transistor 20 and the source 36 of the planar transistor 32. The drain 34 is connected by a metallic interconnect 44 to the polysilicon gate electrode at interconnection locations 46 and 48. The deposited metal input terminal 16, shown as a large bonding pad in FIG. 2 suitable for bonding an input wire from the device package (not shown), is connected to the source diffusion 36 at an interconnection location 50. The source diffusion 36 includes a diffusion constituting the resistor 42 and inherently provides the diode 40 at the junction between the source diffusion 36 and the space charge region 25. Thick oxide 31 is formed over the entire substrate 12 except at the interconnection locations, i.e., 46, 48, 50 and 52. The gate 38 of the transistor 32 is also a polysilicon deposition which may be formed simultaneously with the formation of the gate 24 of the VMOS transistor 20. The gate 38 is connected to the positive voltage supply bus 14 at a connection location 52. The gate electrode 38 is separated from the surface of the integrated circuit 10 by a thin gate oxide layer 39 which may be formed simultaneously with the formation of the gate oxide layer 27 of the VMOS structure 20.

With the circuit of FIG. 1 fabricated as a structure in accordance with the principles illustrated in FIGS. 2 and 3, it will be appreciated that the planar transistor 32 protects the V-groove MOS transistor 20 from gate insulation breakdown. Normal input signal levels with voltages between ground and $|V_{CC} - V_T|$ will pass through the protection transistor 32 from the source 36 to the drain 34 with only an insignificant voltage drop as the transistor 32 will be operating in a linear conduction portion of its transfer characteristic. Whenever an input signal rises to a voltage level which exceeds the difference between the positive supply voltage $V_{CC}$ minus the threshold voltage of the protection transistor 32, this transistor ceases to conduct and effectively isolates the input electrode 28 of the V-groove element 20 from the potentially damaging excessive input voltage.

The inherently formed protection diode 40 is effective to clamp extraneous negative input voltages to levels no greater than its threshold voltage. The diode 40 also effectively protects the gate oxide insulation 39 of the protection transistor 32 from breakdown and rupture. A very high level input signal would be clamped by the diode 40 to its reverse breakdown voltage which is well below the rupture voltage of the transistor 32.

The following example illustrates these concepts in more quantative terms. Typical presently available good quality gate oxides may have a breakdown electric field of about $8 \times 10^6$ volts/cm. Thus, a typical planar gate having an oxide thickness of 800 Angstroms will have a resultant breakdown voltage approximating 60 volts. The breakdown voltage of the sidewalls portions of a V-groove gate oxide would be the same; however, the electric field concentration at the point of the V-groove may result in a breakdown voltage of only 20 volts. A diffused region diode 40 as formed in a typical V-groove process may have a reverse breakdown voltage of 25 volts. This diode would not, by itself, be adequate to protect the V-groove gate. Consequently, the provision of the planar MOS protection transistor 32 in accordance with the principles of the present invention will overcome the drawbacks by blocking voltages in excess of $|V_{CC} - V_T|$. The diode 40 will then provide needed protection to the gate oxide 39 of the planar MOS transistor 32.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. An input protection device for a V-groove field effect transistor formed in a monolithic semiconductor substrate with a source region therein, base region therein overlying said source, and drain region overlying said base region, at least one V-groove extending into the substrate exposing the base region, an insulative layer overlying the exposed portion of the base region, at least one gate conductor overlying at least a portion of the insulative layer and power supply means connected between said drain and said source through load means, said device comprising
  a planar field effect transistor formed on said substrate and having its own source, its own drain and its own insulated gate electrode,
  signal input means for connecting an input signal to said V-groove transistor, said input means being in electrical interconnection with the source of said planar transistor,
  the drain of said planar transistor being in electrical interconnection with said gate conductor of said V-groove transistor,
  the insulated gate electrode being in electrical interconnection with said power supply means, and
  said source of said planar transistor being formed in said substrate in a manner that defines it as a protective diode at a junction of said source and said substrate and at the same time as an input resistor extending from the region of said insulated gate electrode to said signal input means.